United States Patent
Jeckeln (10) Patent No.: US 9,025,699 B2
(45) Date of Patent: May 5, 2015

(54) METHODS AND APPARATUS FOR ALL DIGITAL MULTI-LEVEL OUTPHASING USING BANDWIDTH REDUCTION

(71) Applicant: Samsung Electronics Co., Ltd, Suwon-si, Gyeonggi-do (KR)

(72) Inventor: Ernesto G. Jeckeln, Richardson, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 58 days.

(21) Appl. No.: 13/893,016

(22) Filed: May 13, 2013

(65) Prior Publication Data

US 2014/0334531 A1 Nov. 13, 2014

(51) Int. Cl.
*H03C 3/00* (2006.01)
*H04L 25/06* (2006.01)

(52) U.S. Cl.
CPC ........................................ *H04L 25/06* (2013.01)

(58) Field of Classification Search
CPC .......... H03C 5/00; H03C 3/0966; H03C 3/08; H03C 3/095; H03C 3/0958; H03C 3/0975; H03C 3/0983; H03C 3/40; H03F 1/3247; H03F 3/2176; H03F 1/0294; H03F 1/3241; H03F 1/3282; H03F 1/30; H03F 3/2178; H03F 3/24; H03F 3/217; H03F 3/72; H04L 27/2096; H04L 27/36; H04L 27/361
USPC ......... 375/229, 286, 295, 296, 298, 299, 302, 375/306, 316
See application file for complete search history.

(56) References Cited

U.S. PATENT DOCUMENTS

| | | | |
|---|---|---|---|
| 8,203,386 B2* | 6/2012 | van der Heijden et al. | ... 330/295 |
| 8,749,317 B2* | 6/2014 | Lozhkin | ........................ 332/103 |
| 2009/0021301 A1* | 1/2009 | Hellberg et al. | ........... 330/124 R |
| 2010/0117727 A1* | 5/2010 | Dawson et al. | ........... 330/124 R |
| 2010/0321107 A1* | 12/2010 | Honcharenko | ........... 330/124 R |
| 2011/0215866 A1 | 9/2011 | Dawson et al. | |
| 2011/0273234 A1* | 11/2011 | van der Heijden et al. | ... 330/295 |
| 2012/0069930 A1* | 3/2012 | Vromans et al. | ............... 375/295 |
| 2012/0176195 A1* | 7/2012 | Dawson et al. | ........... 330/124 R |
| 2013/0241625 A1* | 9/2013 | Perreault et al. | ............... 327/355 |

OTHER PUBLICATIONS

Staszewski, et al.; "All-Digital PLL and Transmitter for Mobile Phones"; IEEE Journal of Solid-State Circuits, vol. 40. No. 12; Dec. 2005; 14 pages.

(Continued)

*Primary Examiner* — Hirdepal Singh (57) ABSTRACT

For use in a transmitter in a wireless network, a transmitter apparatus is configured for digital multi-level outphasing. The apparatus includes a bandwidth reduction (BWR) modulator block configured to receive a phase modulated carrier and reduce a bandwidth of the phase modulated carrier using amplitude modulation. The apparatus also includes an outphasing modulator block configured to receive the reduced-bandwidth phase modulated carrier and an amplitude modulated signal, and convert the reduced-bandwidth phase modulated carrier into a plurality of phase modulated signals. The apparatus further includes an amplification stage comprising a plurality of power transistors configured to amplify the phase modulated signals.

17 Claims, 10 Drawing Sheets

(56) References Cited

OTHER PUBLICATIONS

Godoy, et al.; "A 2.5 GHz Asymmetric Multilevel Outphasing Power Amplifier in 65-nm CMOS"; Massachusetts Institute of Technology, Cambridge, MA; 2011 IEEE Topical Conference on Digital Object Identifier; 2011; 5 pages.

Chung, et al; "Asymmetric Multilevel Outphasing Transmitter using Class-E PAs with Discrete Pulse Width Modulation" Microsystems Technology Laboratories, Massachusetts Institute of Technology; IEEE IMS 2010; 4 pages.

Robert Bogdan Staszewski; "State-of-the-Art and Future Directions of High-Performance All-Digital Frequency Synthesis in Nanometer CMOS" IEEE Transactions on Circuits and Systems; Regular Papers, vol. 58. No. 7; Jul. 2011; 14 pages.

* cited by examiner

METHODS AND APPARATUS FOR ALL DIGITAL MULTI-LEVEL OUTPHASING USING BANDWIDTH REDUCTION

TECHNICAL FIELD

The present application relates generally to wireless transmission devices and, more specifically, to methods and apparatus for all digital multi-level outphasing using bandwidth reduction. The methods and apparatus are suitable for next generation mobile wireless communication.

BACKGROUND

Recently, the aggressive cost and power reductions from CMOS-SoC (Complementary Metal-Oxide-Semiconductor System on a Chip) innovations have motivated the search for new multi-gigahertz transceiver architecture based on a digitally intensive approach. Offering an excellent timing accuracy at high frequencies, and superior to the voltage resolution of an analog domain, the digital approach is opening areas of investigation related to all-digital transceiver architectures where signals are processed digitally all the way through the transmitter and receiver paths.

SUMMARY

For use in a transmitter in a wireless network, a transmitter apparatus configured for digital multi-level outphasing is provided. The apparatus includes a bandwidth reduction (BWR) modulator block configured to receive a phase modulated carrier and reduce a bandwidth of the phase modulated carrier using amplitude modulation. The apparatus also includes an outphasing modulator block configured to receive the reduced-bandwidth phase modulated carrier and an amplitude modulated signal, and convert the reduced-bandwidth phase modulated carrier into a plurality of phase modulated signals. The apparatus further includes an amplification stage comprising a plurality of power transistors configured to amplify the phase modulated signals.

For use in a transmitter in a wireless network, a method of digital multi-level outphasing is provided. The method includes receiving, at a BWR modulator block, a phase modulated carrier and reducing a bandwidth of the phase modulated carrier using amplitude modulation. The method also includes receiving, at an outphasing modulator block, the reduced-bandwidth phase modulated carrier and an amplitude modulated signal. The method further includes converting, at the outphasing modulating block, the reduced-bandwidth phase modulated carrier into a plurality of phase modulated signals. The method still further includes amplifying, at an amplification stage comprising a plurality of power transistors, the phase modulated signals.

For use in a wireless communication network, a mobile station configured for digital multi-level outphasing is provided. The mobile station includes a receiving path and a transmitting path. The transmitting path includes a BWR modulator block configured to receive a phase modulated carrier and reduce a bandwidth of the phase modulated carrier using amplitude modulation. The transmitting path also includes an outphasing modulator block configured to receive the reduced-bandwidth phase modulated carrier and an amplitude modulated signal, and convert the reduced-bandwidth phase modulated carrier into a plurality of phase modulated signals. The transmitting path further includes an amplification stage comprising a plurality of power transistors configured to amplify the phase modulated signals.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device.

The following documents and standards descriptions are hereby incorporated into the present disclosure as if fully set forth herein: (i) J. L. Dawson et al., "Asymmetric Multilevel Outphasing Architecture for RF Amplifier", U.S. Patent Publication No. 2011/0215866 (hereinafter "REF1"); (ii) R. B. Staszewski, "Digital Power Amplifier With I/Q Combination", U.S. Patent Publication No. 2011/0129037 (hereinafter "REF2"); (iii) R. B. Staszewski, "All-Digital PLL and Transmitter for Mobile Phones", IEEE Journal of Solid-State Circuits, Vol. 40, No. 12, December 2005 (hereinafter "REF3"); (iv) R. B. Staszewski, "State-of-the-Art and Future Directions of High-Performance All-Digital Frequency Synthesis in Nanometer CMOS", Circuits & Systems I: Regular Papers, IEEE Transactions, July 2011 (hereinafter "REF4"); (v) J. Zhuang, "Bandwidth Reduction Mechanism for Polar Modulation", U.S. Pat. No. 8,204,107 (hereinafter "REF5"); (vi) E. Zipper et al. "A 2.14-GHz Chireix Outphasing Transmitter", U.S. Pat. No. 7,236,753 (hereinafter "REF6"); (vii) Philip A. Godoy, "A 2.5 GHz Asymmetric Multilevel Outphasing Power Amplifier in 65-nm", Massachusetts Institute of Technology, IEEE Conference PAWR 2011 (hereinafter "REF7"); (viii) Sung Won Chung, "Asymmetric Multilevel Outphasing Transmitter using Class E Pas with Discrete Pulse Width Modulator", IEEE IMS 2010 (hereinafter "REF8").

From a power efficiency perspective, governed by the transmit path, polar and outphasing systems are becoming promising transmitter architectures for all digital implementation. One common characteristic of these two architectures is that they both allow the use of emerging digital power amplifiers (DPAs) based on the high efficiency RF switch mode power amplifiers (RF-SMPA), such as Class D and E. These architectures promise significant advantages in terms of efficiency and linearity for next generation mobile wireless communication where battery lifetime and signal quality are important parameters to be optimized.

Embodiments of this disclosure provide an optimal topology for an all-digital multi-level (ML) outphasing architecture using bandwidth reduction. Because the embodiments are all-digital, the RF signals are directly synthesized in the digital domain. The disclosed embodiments are suitable for a wide variety of next generation mobile wireless communication systems.

An important advantage of the disclosed topology is that it eliminates the need for costly discrete supply voltage used in some ML outphasing architectures. In those architectures, the power supply is configured to supply multi-level bias voltages to the power amplifier (PA) in order to change its output power level (see REF1). Such architectures provide improvements in the overall efficiency of the outphasing architecture. As the number of levels increases, the overall efficiency increases. However, in general, cost and complexity increase as the number of bias levels is increased. In contrast, in the disclosed digital PA (DPA) topology, the discrete power levels are controlled by digital words that switch the power transistors "on" or "off" in order to change the number of activated power transistors. This is performed using only one bias level.

Another advantage of the disclosed topology is that it minimizes system complexity by avoiding the use of complex algorithms that synchronize the Asymmetric Multi-levels Outphasing (AMO) technique, such as described in REF1. The algorithm disclosed herein provides for increasing the number of power levels by increasing the number of combinations between the discrete voltage levels of each branch and considering simultaneous unequal discrete voltage values in each branch. In the case of the DPA topology, this is accomplished by only increasing the number N of power transistors without substantially increasing complexity and cost. In the ML outphasing technique, there is an upper bound in terms of the number of levels due to the in-band modulation from switching between levels. This has a direct impact in EVM performance.

In addition, the disclosed topology provides for dynamic optimization of the efficiency of the ML outphasing system by dynamically tuning the Cp (Parallel Cap of the Class E DPA) values according to the levels assigned in the set of multi-level.

The embodiments disclosed herein are applicable to various digital communications systems where the efficiency and cost considerations of the power amplifier system are important factors. For example, the disclosed embodiments are applicable to a number of 4G and 5G wireless mobile communication systems (e.g., LTE, etc.). It will be understood that the disclosed embodiments may be applicable in other communication systems as well.

Figure 1:
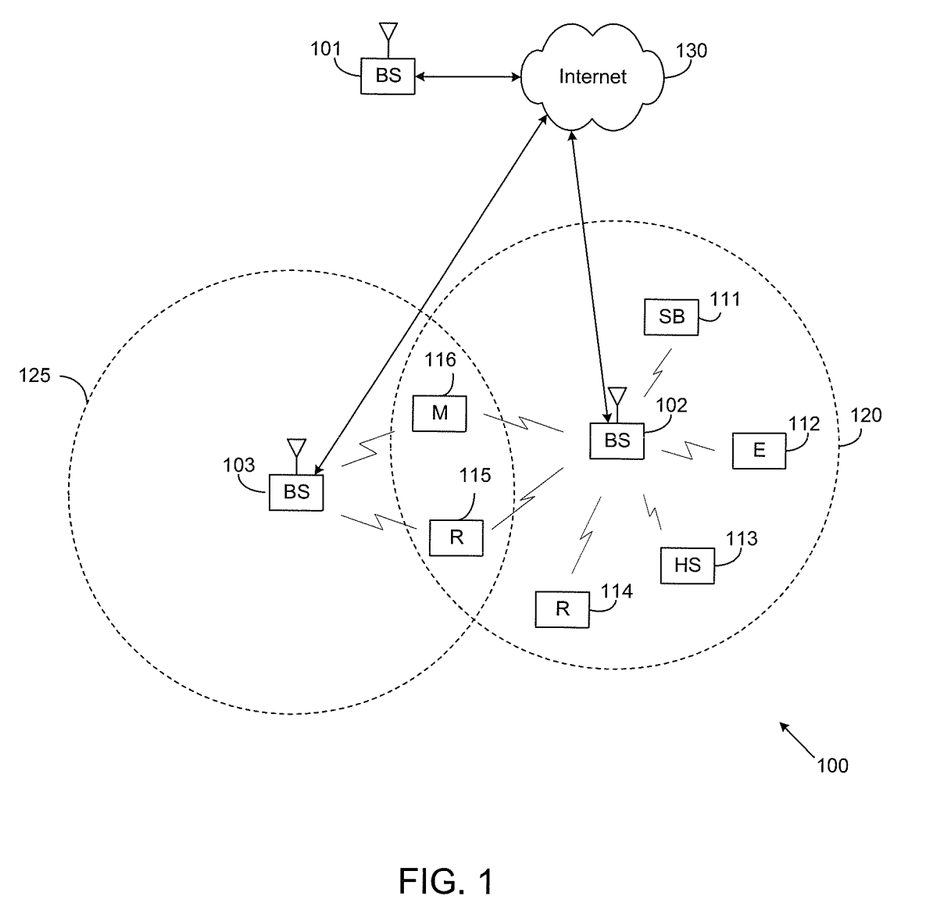
FIG. 1 illustrates a wireless network according to an embodiment of this disclosure.

FIG. 1 illustrates a wireless network 100 according to one embodiment of this disclosure. The embodiment of wireless network 100 illustrated in FIG. 1 is for illustration only. Other embodiments of wireless network 100 could be used without departing from the scope of this disclosure.

The wireless network 100 includes eNodeB (eNB) 101, eNB 102, and eNB 103. The eNB 101 communicates with eNB 102 and eNB 103. The eNB 101 also communicates with Internet protocol (IP) network 130, such as the Internet, a proprietary IP network, or other data network.

Depending on the network type, other well-known terms may be used instead of "eNodeB," such as "base station" or "access point". For the sake of convenience, the term "eNodeB" shall be used herein to refer to the network infrastructure components that provide wireless access to remote terminals.

The eNB 102 provides wireless broadband access to network 130 to a first plurality of user equipments (UEs) within coverage area 120 of eNB 102. The first plurality of UEs includes UE 111, which may be located in a small business; UE 112, which may be located in an enterprise; UE 113, which may be located in a WiFi hotspot; UE 114, which may be located in a first residence; UE 115, which may be located in a second residence; and UE 116, which may be a mobile device, such as a cell phone, a wireless laptop, a wireless PDA, or the like. UEs 111-116 may be any wireless communication device, such as, but not limited to, a mobile phone, mobile PDA and any mobile station (MS).

For the sake of convenience, the term "user equipment" or "UE" is used herein to designate any remote wireless equipment that wirelessly accesses an eNB, whether the UE is a mobile device (e.g., cell phone) or is normally considered a stationary device (e.g., desktop personal computer, vending machine, etc.). In other systems, other well-known terms may be used instead of "user equipment", such as "mobile station" (MS), "subscriber station" (SS), "remote terminal" (RT), "wireless terminal" (WT), and the like.

The eNB 103 provides wireless broadband access to a second plurality of UEs within coverage area 125 of eNB 103. The second plurality of UEs includes UE 115 and UE 116. In some embodiment, eNBs 101-103 may communicate with each other and with UEs 111-116 using LTE or LTE-A techniques.

Dotted lines show the approximate extents of coverage areas 120 and 125, which are shown as approximately circular for the purposes of illustration and explanation only. It should be clearly understood that the coverage areas associated with base stations, for example, coverage areas 120 and 125, may have other shapes, including irregular shapes, depending upon the configuration of the base stations and variations in the radio environment associated with natural and man-made obstructions.

Although FIG. 1 depicts one example of a wireless network 100, various changes may be made to FIG. 1. For example, another type of data network, such as a wired network, may be substituted for wireless network 100. In a wired network, network terminals may replace eNBs 101-103 and UEs 111-116. Wired connections may replace the wireless connections depicted in FIG. 1.

Figure 2:
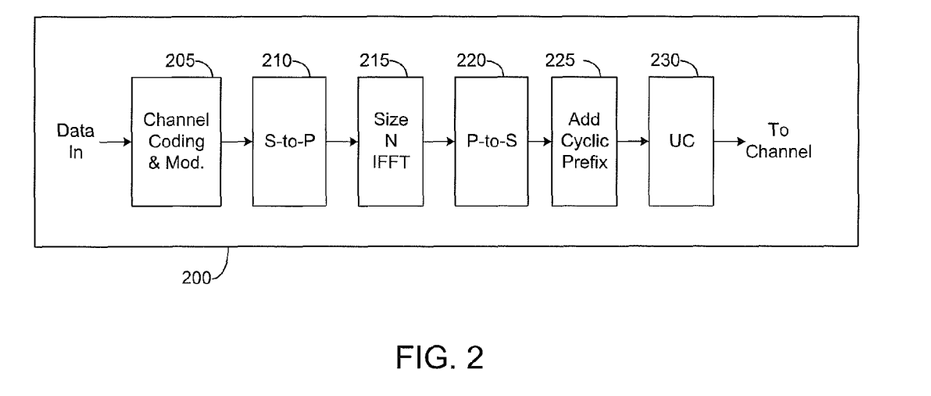
FIG. 2 illustrates a high-level diagram of a wireless transmit path according to an embodiment of this disclosure.
Figure 3:
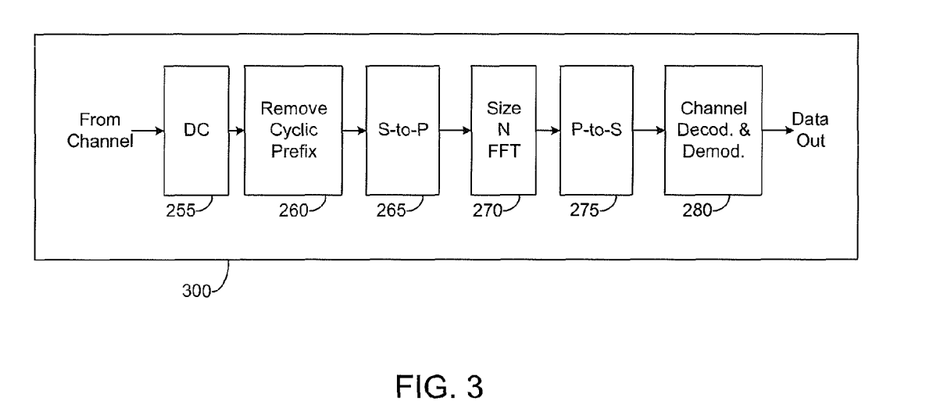
FIG. 3 illustrates a high-level diagram of a wireless receive path according to an embodiment of this disclosure.

FIG. 2 is a high-level diagram of a wireless transmit path. FIG. 3 is a high-level diagram of a wireless receive path. In FIGS. 2 and 3, the transmit path 200 may be implemented, e.g., in eNB 102 and the receive path 300 may be implemented, e.g., in a UE, such as UE 116 of FIG. 1. It will be understood, however, that the receive path 300 could be implemented in an eNB (e.g. eNB 102 of FIG. 1) and the transmit path 200 could be implemented in a UE.

Transmit path 200 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. Receive path 300 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2 and 3 may be implemented in software while other components may be implemented by configurable hardware (e.g., a processor) or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In transmit path 200, channel coding and modulation block 205 receives a set of information bits, applies coding (e.g., LDPC coding) and modulates (e.g., Quadrature Phase Shift Keying (QPSK) or Quadrature Amplitude Modulation (QAM)) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in eNB 102 and UE 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at UE 116 after passing through the wireless channel and reverse operations to those at eNB 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

In accordance with embodiments of this disclosure, the transmit path 200 may include other components, including components associated with all digital multi-level outphasing using bandwidth reduction, as described in greater detail below.

Each of eNBs 101-103 may implement a transmit path that is analogous to transmitting in the downlink to UEs 111-116 and may implement a receive path that is analogous to receiving in the uplink from UEs 111-116. Similarly, each one of UEs 111-116 may implement a transmit path corresponding to the architecture for transmitting in the uplink to eNBs 101-103 and may implement a receive path corresponding to the architecture for receiving in the downlink from eNBs 101-103.

Figure 4:
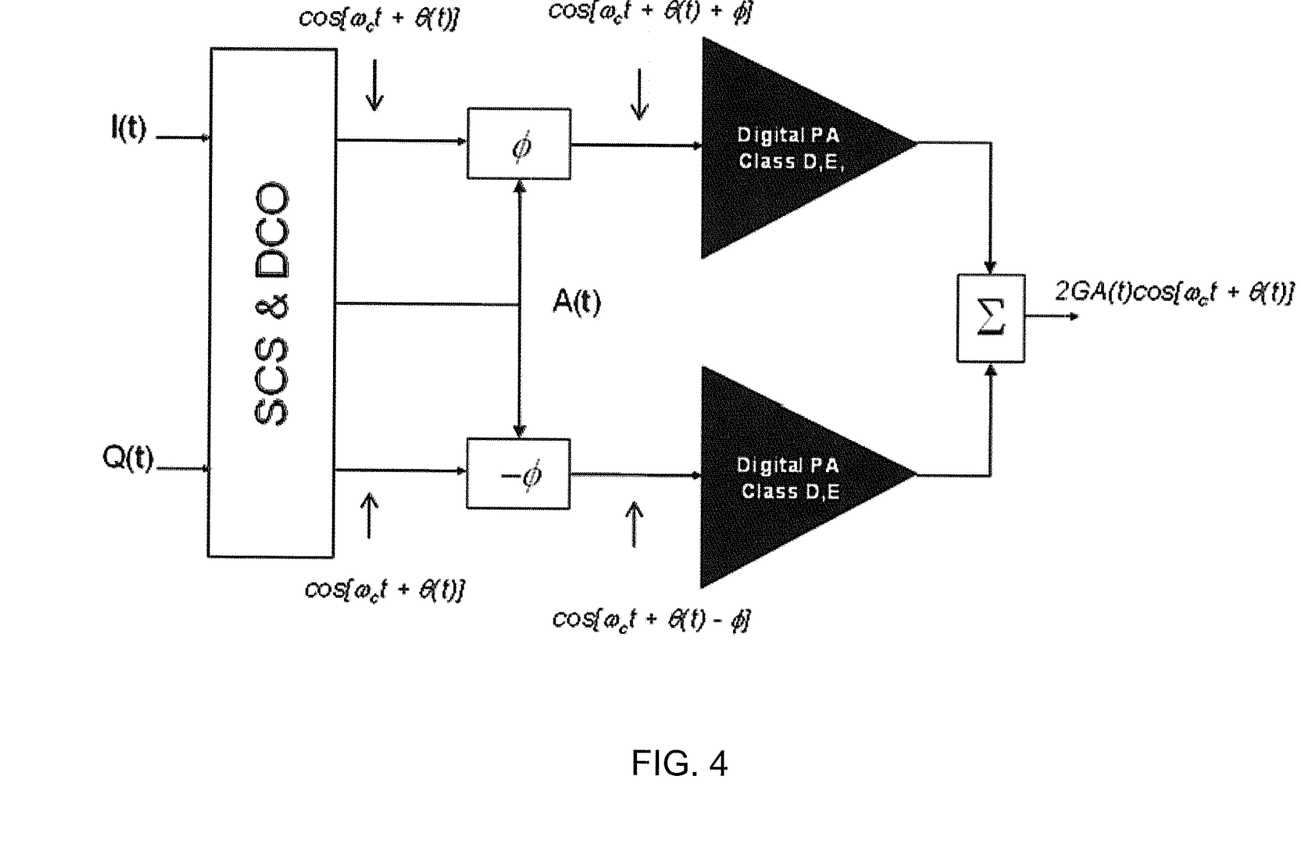
FIG. 4 shows an example block diagram of outphasing architecture, according to an embodiment of this disclosure.

FIG. 4 shows an example block diagram of outphasing architecture, according to an embodiment of this disclosure. The embodiment illustrated in FIG. 4 is for illustration only. Other embodiments could be used without departing from the scope of this disclosure.

In outphasing architecture, which is also referred to as Linear Amplification using Nonlinear Components (LINC), the input signal includes both amplitude and phase modulated components. The input signal is converted into two constant envelope phase-modulated signals by a Signal Component Separator (SCS). These two signals are independently amplified through two similar high efficiency RF amplifiers with gain G at a fixed power level. Then, the amplified version of the original signal is achieved by a reconstruction of the amplitude modulation at the output of a RF combiner.

A frequency synthesizer (e.g., a digitally controlled oscillator, or DCO) creates a discrete set of frequencies controlled by a digital word. The frequency synthesizer generates a carrier with frequency $\omega_c$, which is modulated in phase by the phase component $\theta(t)$ of the complex input signal. The resulting phase modulated digital carrier is split in two paths and is represented by the following equation:

$$S_c=(t)=\cos(\omega_c t+\theta(t)) \quad\quad\quad\quad \text{[Eqn. 1]}$$

In both paths, the phase modulated carrier is modulated by an outphasing angle $\phi(t)$, which is responsible for the amplitude modulation component A(t) of the complex signal. The two paths are modulated in opposite directions, that is, +$\phi(t)$ and −$\phi(t)$. The resulting phase modulated signals with constant envelope are given by:

$$S_1(t)=\cos(\omega t+\theta(t)+\phi) \quad\quad\quad\quad \text{[Eqn. 2]}$$

$$S_2(t)=\cos(\omega t+\theta(t)-\phi) \quad\quad\quad\quad \text{[Eqn. 3]}$$

The amplified version of the original signal is obtained at the output of an RF combiner as a sum of $S_1(t)$ and $S_2(t)$. The resulting output is an amplified replica (with gain equal to G) of the original signal as the in-phase components (θ(t)) add together and the out-of-phase components (φ) cancel each other. The resulting output is given by the following equation:

$$S_{out}(t)=2GA(t)\cos(\omega_c t+\theta(t)), \quad [\text{Eqn. 4}]$$

as shown in FIG. 4.

The outphasing architecture shown in FIG. 4 may improve overall efficiency in amplification. As the number of levels increases, the overall efficiency increases. However, cost and complexity also increase as the number of bias levels is increased. Furthermore, the outphasing architecture of FIG. 4 does not include bandwidth reduction processing to relax the bandwidth of the outphasing paths.

Topology with BWR Method

Figure 5:
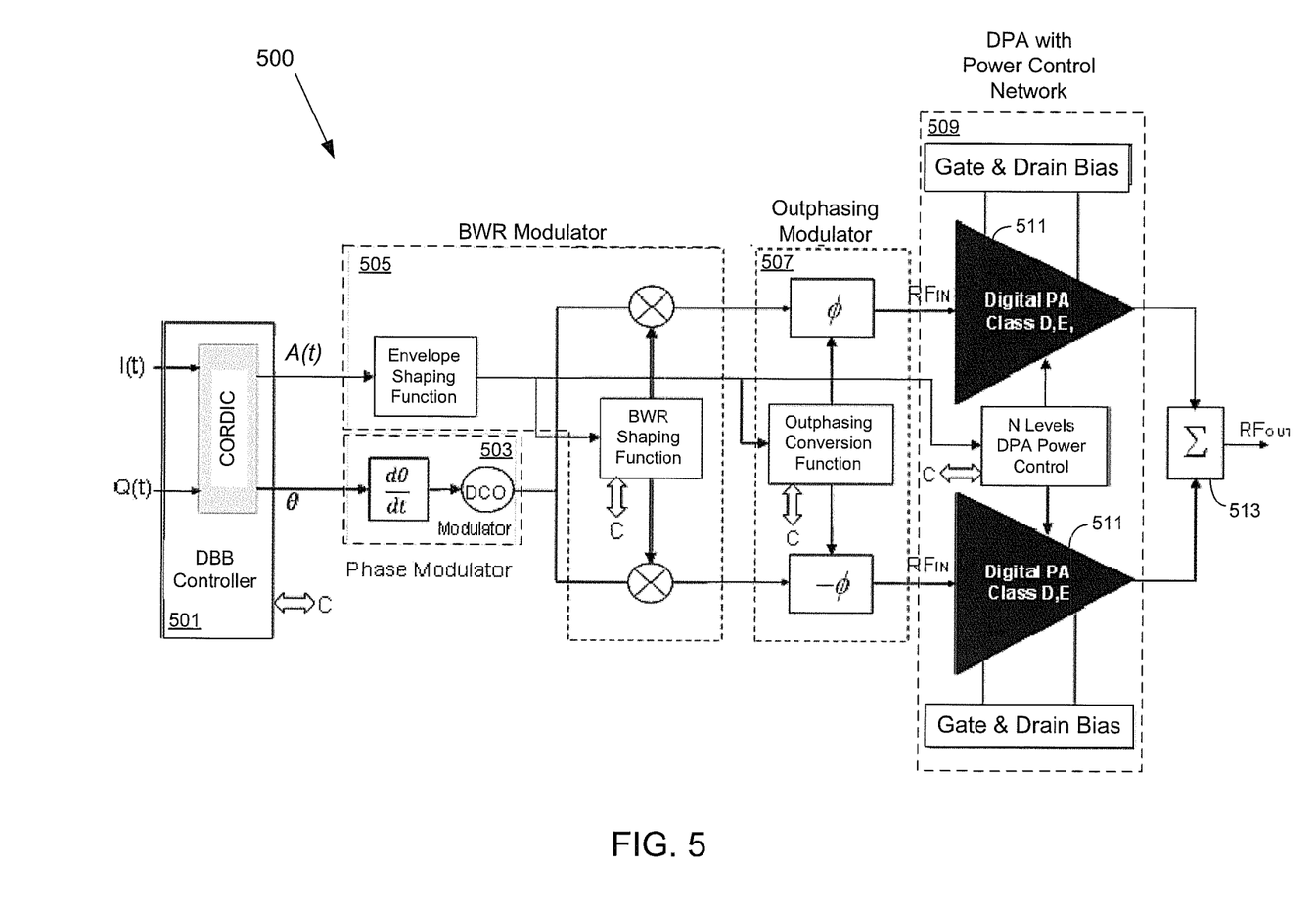
FIG. 5 illustrates an example transmitter apparatus that includes all-digital multi-level outphasing, according to an embodiment of this disclosure.

FIG. 5 illustrates an example transmitter apparatus that includes all-digital ML outphasing, according to an embodiment of this disclosure. The embodiment illustrated in FIG. 5 is for illustration only. Other embodiments could be used without departing from the scope of this disclosure.

As shown in FIG. 5, the transmitter apparatus is divided into sections according to the frequencies at which they operate, radio-frequency (RF) or baseband (BB). The transmitter apparatus 500 includes a digital baseband (DBB) controller 501, a phase modulator block 503, a bandwidth reduction (BWR) modulator block 505, an outphasing modulator block 507, and an amplification stage 509.

The DBB controller 501 converts BB input I and Q signals to polar form and separately modulates the phase of carrier into both amplitude A(t) and phase θ(t) components of the signal. In the phase modulator block 503, the frequency synthesizer is a digitally controlled oscillator (DCO) that creates a discrete set of frequencies controlled by a digital word. The DCO generates a RF carrier with frequency $\omega_c$. The RF carrier is split in two components in order to be phase modulated by the outphasing modulators in the outphasing modulator block 507.

The two $RF_{IN}$ signals are constant envelope phase modulated signals for cases when the BWR modulator block 505 is bypassed. The signals are amplified through two substantially identical or similar high efficiency RF-DPAs 511, having a gain G at digitally variable power levels. The amplified version of the original signal is achieved by a reconstruction of the amplitude modulation at the output of a RF combiner 513.

The various components, functions, and blocks depicted in FIG. 5 may be embodied by software (e.g., software code), hardware (e.g., one or more processors, controllers, or circuitry), or a combination of hardware and software, as described in greater detail below.

Bandwidth Reduction Modulator

Unlike in some transmitters, the linearity of the outphasing architecture does not depend upon the linearity of the RF power transistor. Instead, any distortion observed at the output signal is generally caused by gain and phase imbalance between the two RF branches. In addition, the limited bandwidth in both branches generates a group delay ripple affecting the phase modulated signals.

Figure 6:
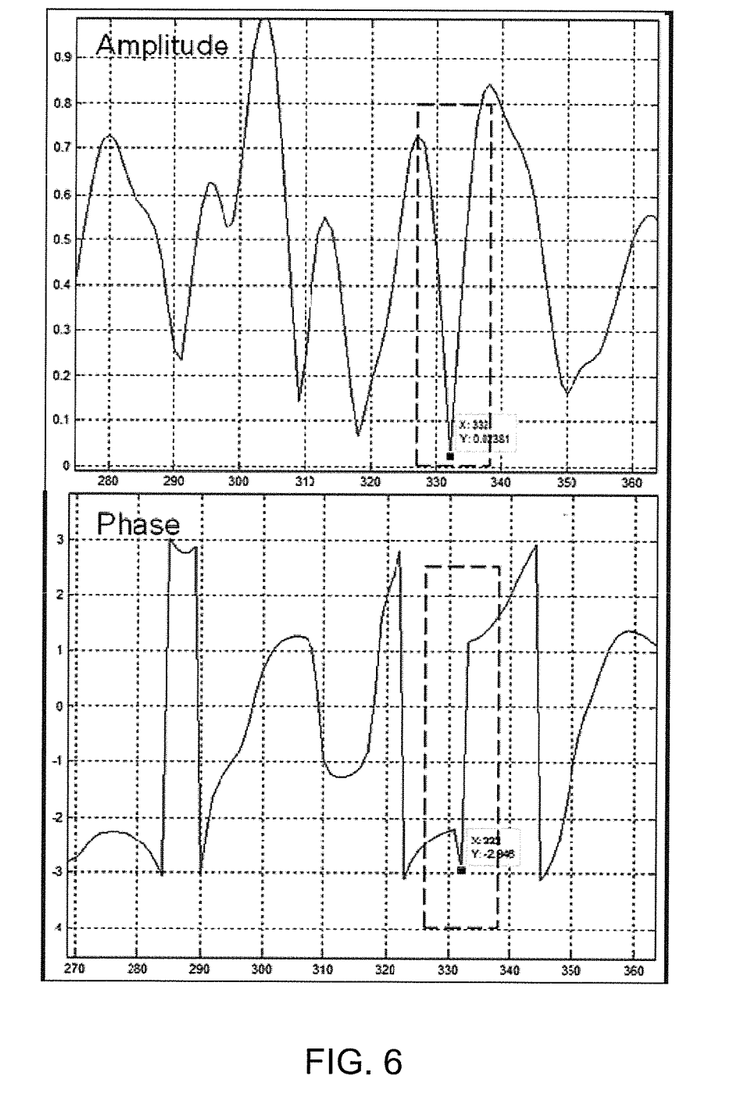
FIG. 6 illustrates envelope and phase signals showing phase discontinuities.

It can be shown that by separating both the amplitude and phase modulation from the complex modulated signal, the phase components exhibit extreme bandwidth in comparison to the complex signal. The phase signal reveals rapid phase changes, occurring only when the amplitude of the complex signal is low, as shown in FIG. 6. FIG. 6 illustrates that the first derivative of the phase waveform shows discontinuity. The rapid phase changes are responsible for the extended bandwidth. The phase changes stress the system in terms of the dynamic bandwidth, making the outphasing system impractical for wideband applications.

It is possible to reduce the bandwidth by increasing the amplitude of the phase signal (by amplitude modulation) when the complex signal has low amplitude. In addition, inspection of the amplitude signal in FIG. 6 reveals that valleys become sharper at lower signal amplitude. Therefore, by softening or smoothing the valleys (e.g., reducing the amplitude of the valleys), the bandwidth of the envelope waveform can be reduced. Both techniques can be implemented in a BWR modulator block in a straightforward manner by one or more mathematical formulations implemented into look-up tables (LUTs).

Figure 7:
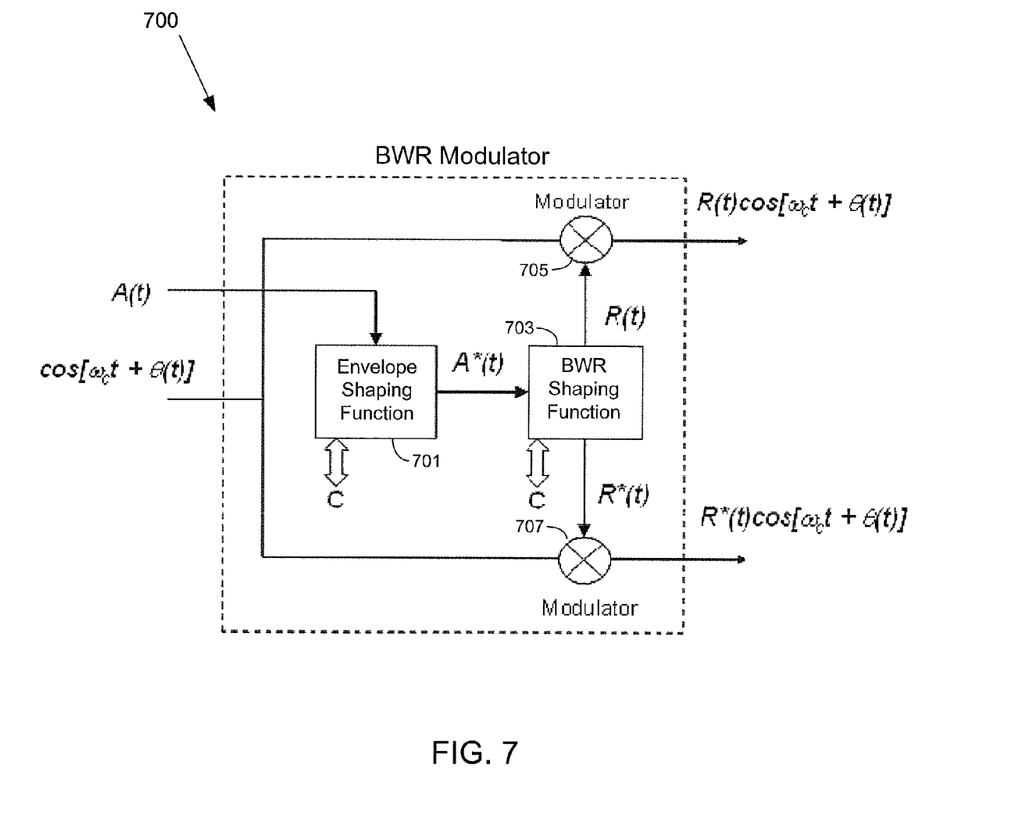
FIG. 7 illustrates an example BWR (bandwidth reduction) modulator block, according to an embodiment of this disclosure.

FIG. 7 illustrates an example BWR modulator block, according to an embodiment of this disclosure. The BWR modulator block 700 may represent the BWR modulator block 505 in FIG. 5. The embodiment illustrated in FIG. 7 is for illustration only. Other embodiments could be used without departing from the scope of this disclosure.

The BWR modulator block 700 is configured to implement the BWR techniques described above based on a residual amplitude modulation algorithm. The BWR modulator block 700 processes a residual amplitude modulation of the phase modulated carrier according to two shaping functions.

The BWR modulator block 700 includes an envelope shaping function block 701, a BWR shaping function block 703, and two real modulators 705, 707. The envelope shaping function block 701 uses an envelope shaping LUT to reduce the envelope bandwidth. The BWR shaping function block 703 uses a BWR shaping LUT to reduce the phase bandwidth. The two real modulators 705, 707 modulate both paths of phase signals with constant envelope, according to the variation of the residual envelope R(t). The residual envelope R(t) is generated by shaping the valleys and peaks of the envelope of the complex input signal according to both the envelope shaping function block 701 and the BWR shaping function block 703. The difference between R(t) and R*(t) takes into consideration the gain imbalance compensation between the two RF branches, which is implemented during the computation of the shaping functions 701, 703.

Figure 8:
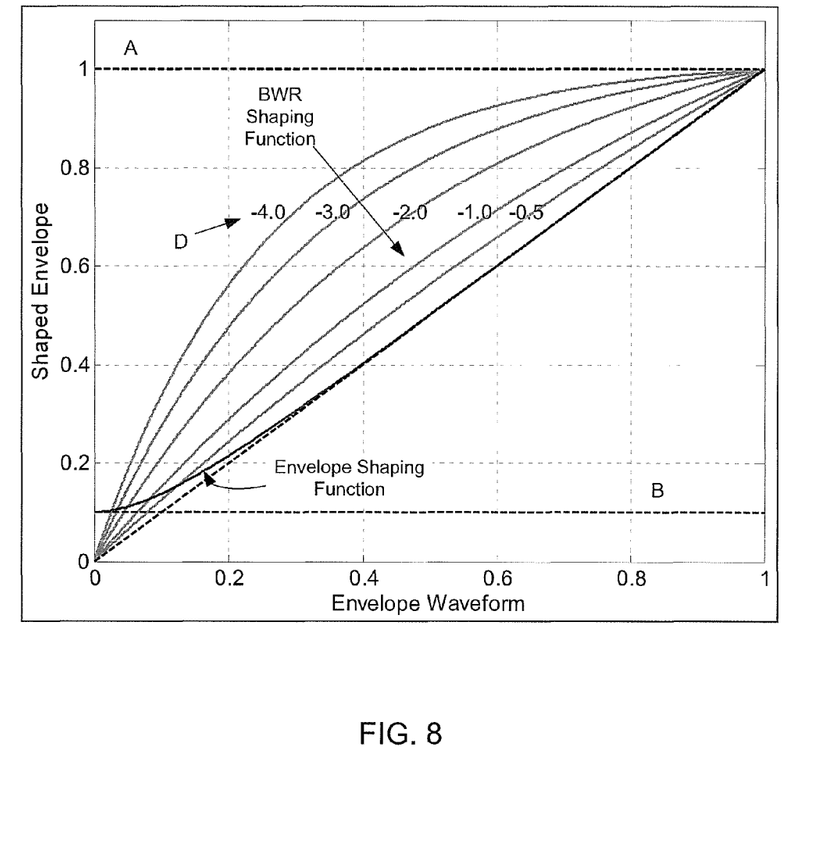
FIG. 8 illustrates an envelope shaping function and a BWR shaping function, according to an embodiment of this disclosure.

FIG. 8 illustrates the envelope shaping function and the BWR shaping function. The parameter "D", upper threshold "A", and lower threshold "B" shown in FIG. 8 are adjusted in order to control and optimize the magnitude of the shaping.

Figure 9:
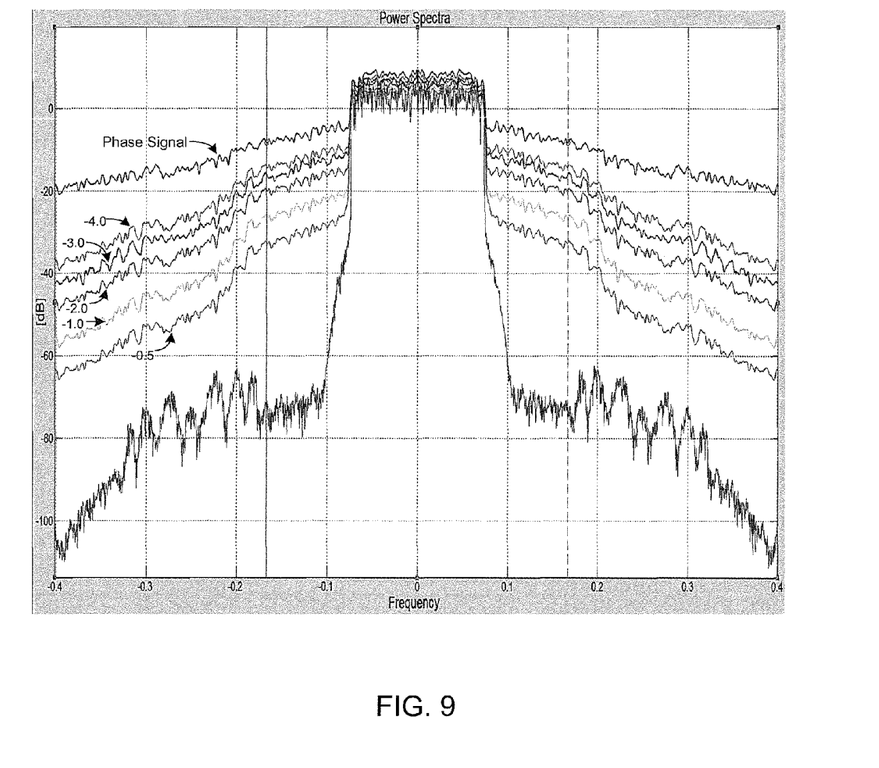
FIG. 9 illustrates the performance of a BWR modulator in reducing the bandwidth of the phase modulated carrier, according to an embodiment of this disclosure.

FIG. 9 illustrates the performance of the BWR modulator 700 in reducing the bandwidth of the phase modulated carrier, according to an embodiment of this disclosure. The BWR algorithm takes advantage of a property of a Class E amplifier, in which variations in the input signal may not be reproduced at the output in an acceptable form. Therefore, any modulation performed by the BWR modulator 700 has little or no impact at the output of the amplifier that could distort the reconstructed signal at the output of the outphasing architecture.

Outphasing Modulator

Figure 10:
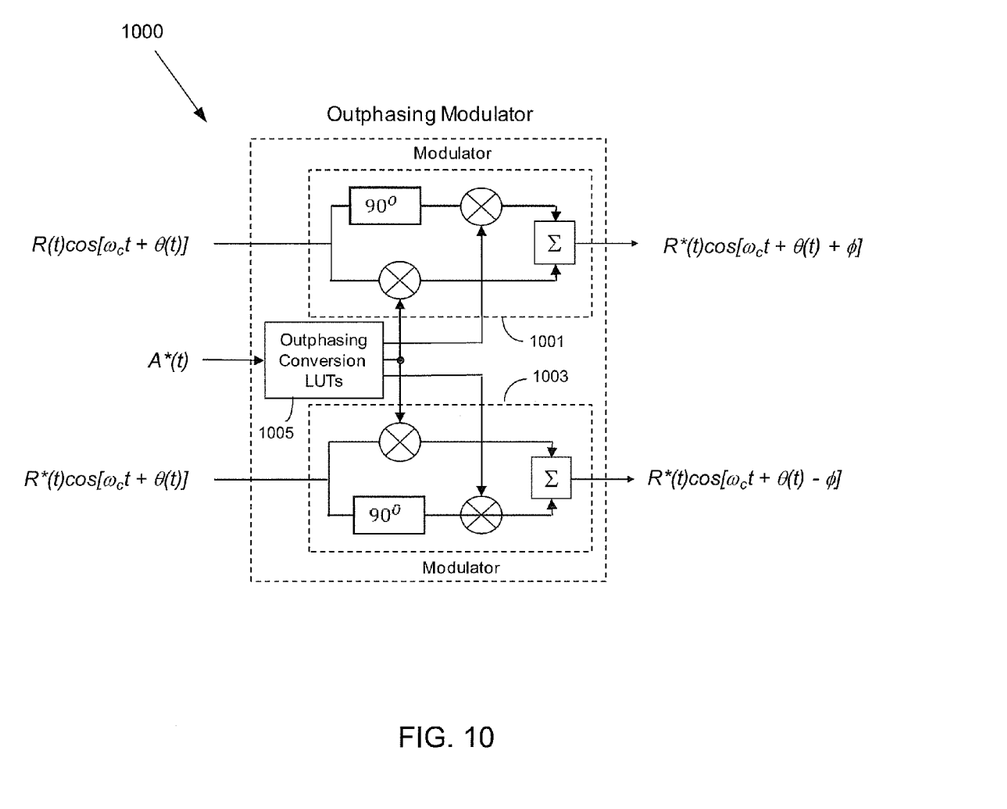
FIG. 10 illustrates an example outphasing modulator block, according to an embodiment of this disclosure.

FIG. 10 illustrates an example outphasing modulator block, according to an embodiment of this disclosure. The outphasing modulator block 1000 may represent the outphasing modulator block 507 in FIG. 5. The embodiment illustrated in FIG. 10 is for illustration only. Other embodiments could be used without departing from the scope of this disclosure.

The outphasing modulator 1000 converts a BB amplitude modulated signal with constant phase into two RF phase modulated vectors with constant amplitude. The outphasing modulator 1000 includes two quadrature I/Q modulators 1001, 1003 with RF input and RF output at the carrier frequency $\omega_c$, and two one-dimensional look-up tables 1005, which are driven by the envelope waveform A*(t). To create the phase modulation, two quadrature BB vectors, which are generated according to the LUT functions, modulate the in-phase and quadrature components of both quadrature I/Q modulators in opposite directions according to the following the trigonometric relationship:

$$\cos(\omega_c t + \theta(t) \mp \varnothing(t)) = \cos(\varnothing(t))\cos(\omega_c t + \theta(t)) \pm \sin(\varnothing(t))\sin(\omega_c t + \theta(t)).$$

Other than the residual amplitude modulation performed by the R(t) and R*(t) components from the BWR modulator block, the outphasing modulator block 1000 may not have any implication in terms of amplitude modulation. Without the BWR action, both RF outputs should be phase modulated carriers with constant envelope to drive the DPA stage. In addition, like the BWR modulator that considers gain imbalance compensation, the outphasing modulator includes phase imbalance compensation to compensate phase difference between the two RF branches. It is implemented into the outphasing conversion block by statically adding incremental phases in one of the quadrature modulators.

DPA with Power Control Network

Figure 11:
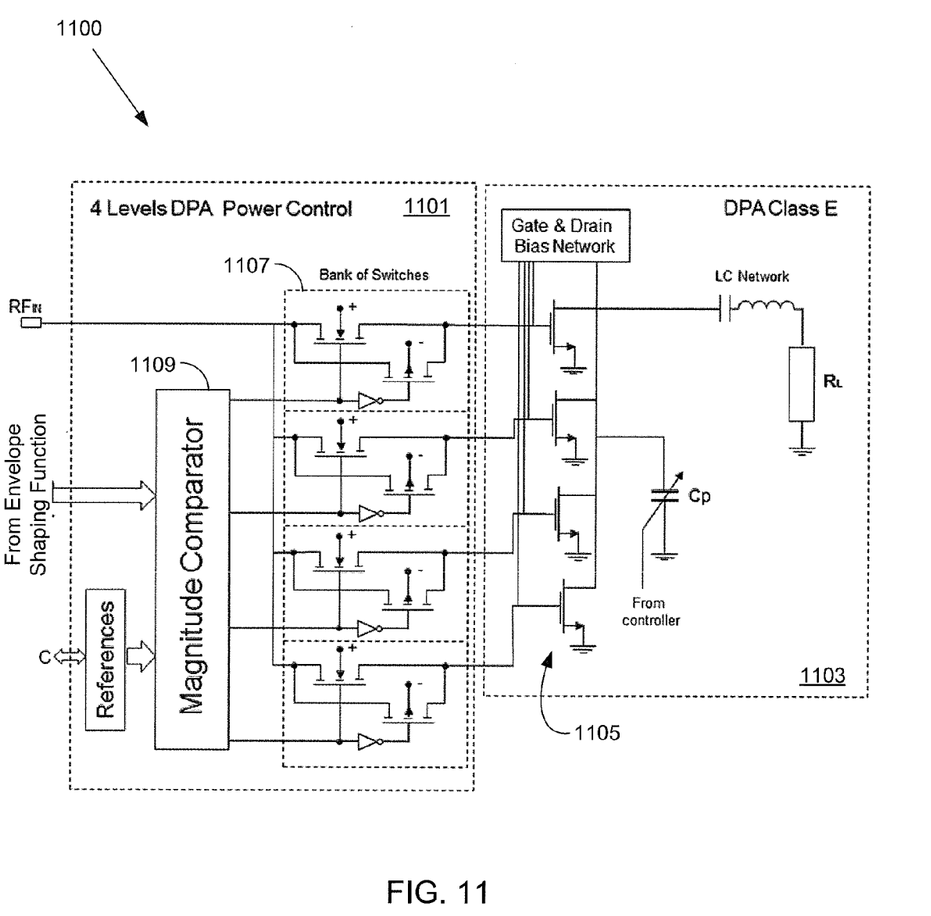
FIG. 11 illustrates an example digital power amplifier (DPA) with power control network, according to an embodiment of this disclosure.

FIG. 11 illustrates an example digital power amplifier (DPA) with power control network, according to an embodiment of this disclosure. The DPA 1100 may represent the amplification stage 509 in FIG. 5. The embodiment illustrated in FIG. 11 is for illustration only. Other embodiments could be used without departing from the scope of this disclosure.

The DPA 1100 provides an amplification stage of an all-digital architectural solution where RF signals are directly synthesized in the digital domain. The DPA 1100 includes four levels of DPA power control 1101 and a digitally controlled DPA Class E block 1103 with four power transistors 1105. The power transistors 1105 are configured to allow changing of the output power level. The number of active power transistors 1105 is controlled through a bank of CMOS switches 1107. Each CMOS switch 1107 includes two transistors, an n-channel transistor and a p-channel transistor, connected in parallel.

The control voltages at the gates of the transistors of the switches 1107 are digital and complementary. Therefore, one transistor switch is controlled directly while the second one is controlled through an inverter. Each cell of the bank of switches 1107 functions like a bi-directional semiconductor allowing a signal to pass in either direction with equal ease. The bank of switches 1107 allows passing the phase modulated carrier through all activated power transistors. Although FIG. 11 is shown and described with four power transistors 1105 and power control levels 1101, it will be understood that the number of power transistors and power control levels can be fewer or greater than four. The control is performed by the magnitude comparator block 1109 according to the envelope variation and reference values assigned by the controller. The efficiency of the DPA 1100 is optimized by considering optimal Cp values for each output power level.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A transmitter apparatus configured for digital multi-level outphasing, the apparatus comprising:
   a bandwidth reduction (BWR) modulator block configured to receive a phase modulated carrier and reduce a bandwidth of the phase modulated carrier using amplitude modulation, the BWR modulator block comprising an envelope shaping function block and a BWR shaping function block;
   an outphasing modulator block configured to receive the reduced-bandwidth phase modulated carrier and an amplitude modulated signal, and convert the reduced-bandwidth phase modulated carrier into a plurality of phase modulated signals; and
   an amplification stage comprising a plurality of power transistors configured to amplify the phase modulated signals.

2. The apparatus of claim 1, further comprising:
   a digital baseband (DBB) controller configured to receive in-phase and quadrature input signals and modulate the signals to amplitude and phase components.

3. The apparatus of claim 2, further comprising:
   a phase modulator block configured to receive the phase component from the DBB controller, generate a RF carrier, and output the phase modulated carrier.

4. The apparatus of claim 1, wherein the outphasing modulator block comprises a plurality of quadrature I/Q modulators.

5. The apparatus of claim 1, wherein a number of active power transistors in the amplification stage is controlled using a plurality of CMOS (Complementary Metal-Oxide-Semiconductor) switches.

6. The apparatus of claim 1, wherein the transmitter is a mobile station or a base station.

7. A method of digital multi-level outphasing, the method comprising:
   receiving, at a bandwidth reduction (BWR) modulator block, a phase modulated carrier and reducing a bandwidth of the phase modulated carrier using amplitude modulation, the BWR modulator block comprising an envelope shaping function block and a BWR shaping function block;
   receiving, at an outphasing modulator block, the reduced-bandwidth phase modulated carrier and an amplitude modulated signal;
   converting, at the outphasing modulating block, the reduced-bandwidth phase modulated carrier into a plurality of phase modulated signals; and
   amplifying, at an amplification stage comprising a plurality of power transistors, the phase modulated signals.

8. The method of claim 7, further comprising:
   receiving, at a digital baseband (DBB) controller, in-phase and quadrature input signals and modulating the signals to amplitude and phase components.

9. The method of claim 8, further comprising:
   receiving, at a phase modulator block, the phase component from the DBB controller, generating a RF carrier, and outputting the phase modulated carrier.

10. The method of claim 7, wherein the outphasing modulator block comprises a plurality of quadrature I/Q modulators.

11. The method of claim 7, wherein a number of active power transistors in the amplification stage is controlled using a plurality of CMOS (Complementary Metal-Oxide-Semiconductor) switches.

12. The method of claim 7, wherein the transmitter is a mobile station or a base station.

13. A mobile station configured for digital multi-level outphasing, the mobile station comprising:
    a receiving path; and
    a transmitting path, the transmitting path comprising:
       a bandwidth reduction (BWR) modulator block configured to receive a phase modulated carrier and reduce a bandwidth of the phase modulated carrier using amplitude modulation, the BWR modulator block comprising an envelope shaping function block and a BWR shaping function block;

an outphasing modulator block configured to receive the reduced-bandwidth phase modulated carrier and an amplitude modulated signal, and convert the reduced-bandwidth phase modulated carrier into a plurality of phase modulated signals; and an amplification stage comprising a plurality of power transistors configured to amplify the phase modulated signals.

14. The mobile station of claim 13, further comprising:
a digital baseband (DBB) controller configured to receive in-phase and quadrature input signals and modulate the signals to amplitude and phase components.

15. The mobile station of claim 14, further comprising:
a phase modulator block configured to receive the phase component from the DBB controller, generate a RF carrier, and output the phase modulated carrier.

16. The mobile station of claim 13, wherein the outphasing modulator block comprises a plurality of quadrature I/Q modulators.

17. The mobile station of claim 13, wherein a number of active power transistors in the amplification stage is controlled using a plurality of CMOS (Complementary Metal-Oxide-Semiconductor) switches.

* * * * *